(12) United States Patent
Rosner et al.

(10) Patent No.: US 7,610,174 B2
(45) Date of Patent: Oct. 27, 2009

(54) SYSTEM FOR ASSURED RELIABILITY IN DC TO AC POWER CONVERTERS

(75) Inventors: S Jeffrey Rosner, Palo Alto, CA (US); Charles D Hoke, Menlo Park, CA (US); Ken A Nishimura, Fremont, CA (US)

(73) Assignee: Agilent Technologies, Inc, Santa Clara, CA (US)

( * ) Notice: Subject to any disclaimer, the term of this patent is extended or adjusted under 35 U.S.C. 154(b) by 320 days.

(21) Appl. No.: 11/555,135

(22) Filed: Oct. 31, 2006

(65) Prior Publication Data
US 2008/0215294 A1    Sep. 4, 2008

(51) Int. Cl.
G06F 19/00    (2006.01)
G06F 17/40    (2006.01)

(52) U.S. Cl. .......................... 702/184; 702/64; 702/65; 700/286

(58) Field of Classification Search ................. 702/184, 702/64, 65
See application file for complete search history.

(56) References Cited

U.S. PATENT DOCUMENTS

| | | | | |
|---|---|---|---|---|
| 4,562,382 | A | * | 12/1985 | Elliott ........................ 315/219 |
| 5,877,419 | A | * | 3/1999 | Farokhzad .................. 73/432.1 |
| 6,804,127 | B2 | * | 10/2004 | Zhou ........................... 363/37 |
| 2005/0226017 | A1 | * | 10/2005 | Kotsopoulos et al. ....... 363/125 |

FOREIGN PATENT DOCUMENTS

JP    11-332289    11/1999
JP    11-332289 A    11/1999

OTHER PUBLICATIONS

Venet et al., "Influence of aging on electrolytic capacitors function in static converters: Fault prediction method", 5 European Physical Journal, Applied Physics, 71-83 (1999).
Lahyani et al., "Failure Prediction of Electrolytic Capacitors During Operation of a Switchmode Power Supply", 13 IEEE Transactions on Power Electronics, No. 6, 1199-1207 (Nov. 1998).
Ciampi et al., "A Novel Thermomechanics-Based Lifetime Prediction Model for Cycle Fatigue Failure Mechanisms In Power Semiconductors", 42 Microelectronics Reliability, 1653-1658 (2002).
de Lambilly et al., "Failure Analysis of Power Modules: A Look at the Packaging and Reliability of Large IGBTs", 16 IEEE Transactions of Components, Hybrids and Manufacturing Technology, No. 4, 412-417 (Jun. 1993).

* cited by examiner

Primary Examiner—Hal D Wachsman

(57) ABSTRACT

A distributed power generation system enabled for assured reliability comprises a direct current power source, a direct current to alternating current converter (DTAC), electrically coupled to the direct current power source, the DTAC comprising a reliability limiting component (RLC) and a sensor for sensing a measurable parameter of the RLC. A decision engine is communicatively coupled to the sensor, and is operable to determine a lifetime estimate for the RLC based on the measurable parameter. A service provider is communicatively coupled to the decision engine by a communication system to receive a signal communicating the lifetime estimate. The service provider schedules preventative maintenance based on the signal communicating the lifetime estimate.

20 Claims, 1 Drawing Sheet

SYSTEM FOR ASSURED RELIABILITY IN DC TO AC POWER CONVERTERS

BACKGROUND

In many applications of direct current to alternating current converters (DTAC) high reliability is a critical feature. Applications of DTAC includes Uninterruptible Power Supplies (UPS), Inverters for Photovoltaics (IPV), windpower systems and micro turbine power generating systems which are becoming more important as business operations and others seek independence from local electrical power grids.

Typically, the reliability of the DTAC is dependent on a relatively small number of components that have a failure physics that limits the lifetime to cost tradeoff to an unsatisfactory level. For example, in IPV systems the time to failure is typically dominated by the failure of the electrolytic capacitors that sit between the switches that provide the time varying AC and the DC current output from the photovoltaic cells. Hence, the electrolytic capacitors experience a substantial AC current typically referred to as "ripple current" which provides the main wear out mechanism for electrolytic capacitors. The equivalent circuit model for the electrolytic capacitor includes a series combination of a resistor (Equivalent Series Resistance or ESR) and the capacitance. The $I^2R$ losses associated with the ESR result in self-heating of the electrolytic capacitor which degrades the electrolyte and raises the ESR. This eventually results in a runaway condition causing failure of the electrolytic capacitor which may result in destruction of other components of the DTAC.

Efforts to address the problem of electrolytic capacitor include improving the reliability of the electrolytic capacitors. These efforts are relatively mature at this point which suggests that future improvements in electrolytic capacitor reliability will be small. However, for reasonable size and cost, the reliability of the electrolytic capacitor effectively provides the limiting factor on the lifetime of electronic assemblies built around it. For example, modem IPV systems are typically offered with a five year warranty while the mean time between failure is on the order of six to eight years. This contrasts with the typical warranty for PV panels which are in the range from about 25-30 years.

Improvements in engineering have been largely incremental and design oriented. For example, the requirement that only three-phase operation is provided for DTAC having high power ratings reduces ripple current by balancing the phase loads. However, this acts as an arbitrary constraint on use conditions to improve reliability, and is only completely effective if the three-phase loads are completely balanced. Cooling of the capacitors extends the working life substantially, leading to various heatsink arrangements and forced airflow while increasing noise and power consumption. Other examples include active ripple current management (JP 11-332289) and DTAC designs for minimum capacitance (U.S. Pat. No. 6,804,127).

A secondary failure mechanism is failure of the switching mechanisms typically present in DTAC. The power switches are typically field effect transistors (FET), insulated-gate bipolar transistors (IGBT), gate turn-off devices (GTO) or emitter turn-off switches (ETO). A typical failure mechanism for power switches is thermo-mechanical stress. For example, thermo-mechanical stresses in conventional IGBT devices can cause failure from wire bond fatigue, substrate cracking, and solder fatigue during the operational lifetime of the device.

SUMMARY

In accordance with the invention, a system for assured reliability in DC to AC power converters with application to distributed power generation systems is presented. Reliability limiting components of the DC to AC power converters are monitored and the monitored data is used to drive servicing decisions.

DETAILED DESCRIPTION

Figure 1:
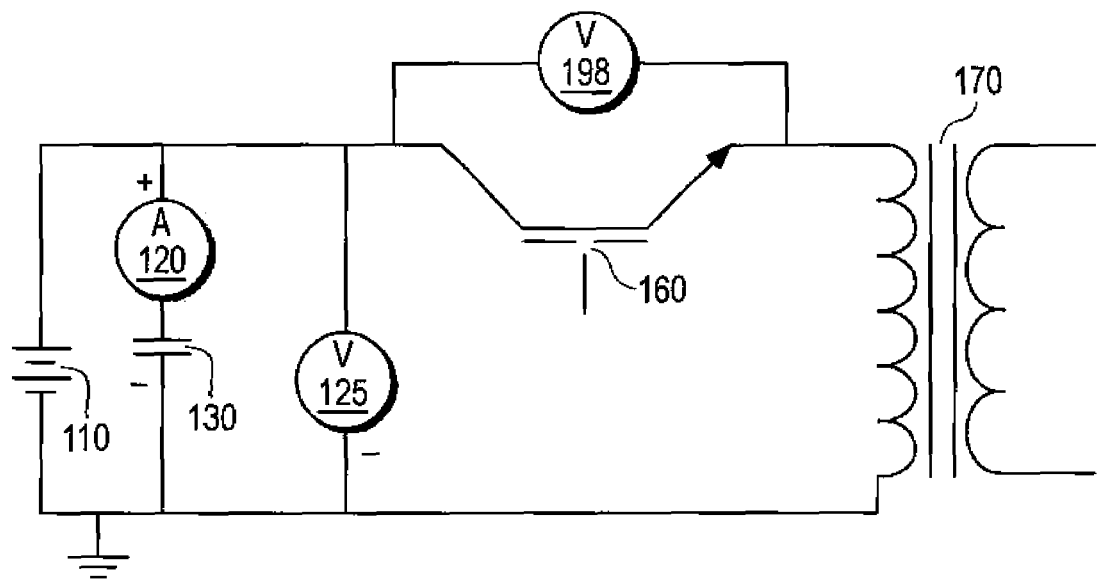
FIG. 1 shows a simplified schematic for illustrating the concept of an invertor for photovoltaics.

In accordance with the invention, it is assumed that efforts will continue to be made to improve design reliability of DTAC but that these efforts will not achieve a thirty year DTAC design life. The large scale growth in commercial PV installations and the trend to large commercial installations driven by economics indicates that assurance of uninterrupted performance is becoming increasingly important. In accordance with the invention, a periodic maintenance method for DTAC to provide uninterrupted performance at an acceptable cost is provided.

Presently, the approach is to operate the DTAC to failure which is typically the end of life of one of the electrolytic capacitors. A single capacitor is typically not sufficient for anything greater than a 1 kW inverter. Common converters in the 3-5 kW range that operate on a single photovoltaic string may typically use as many as six high-voltage capacitors in parallel. Note that series configurations of capacitors require substantial de-rating due to mismatches in actual capacitor values. The failure of electrolytic capacitors occurs stochastically and typically causes irreparable damage to the DTAC as the failure is commonly accompanied by explosion of the electrolytic capacitor. The typical remedy is to order a replacement DTAC or obtain the replacement unit from a costly inventory process and transport the replacement DTAC to the site of the failure, typically using a truck on demand. Typical downtimes are on the order of a week because of the time required to execute the procedure and labor costs are typically on the order of $5000, $30,000 in material assuming a 30 kW DTAC while incurring as much as $1000 in energy costs (assuming time of day pricing in a hot climate at peak demand).

In accordance with the invention, the method includes: 1) a DTAC system having a small number of reliability limiting components (RLCs) that may be readily replaced in a maintenance operation by the service provider 2) a measurement system to track the performance degradation of the RLCs to provide estimates of time-to-failure 3) a decision engine, including circuitry, software or a combination thereof, that determines an appropriate replacement time for the RLCs typically based on some combination of the understanding of the failure physics, thresholding, historical statistical performance records of similar devices, overall system performance and other similar factors 4) a communication system for notifying the service provider who may be the owner/ operator, the integrator/installer or third party service provider of the impending need for RLC replacement.

Reliability validation affords a straightforward way to identify the small number of RLC that dominate the failures of the DTAC systems. For example, an RLC in IPV systems is the electrolytic capacitor as mentioned above. The electrolytic capacitors can be implemented in an IPV system for easy replacement by providing the electrolytic capacitors with reliable interconnects and by providing direct access to the electrolytic capacitors from outside the cabinet that houses the IPV system, similar to the way that high power fuse blocks are typically exchanged. Specifically in an embodiment, a lever can be provided that opens the circuit to shut off current flow to the electrolytic capacitor and removes pressure from a sealing flange. The electrolytic capacitor may be equipped with pop-up handles to facilitate removal and replacement. In cases where uninterrupted operation is critical, redundant electrolytic capacitors can be provided and for the case of IPV systems the exchange can be performed outside of daylight hours when the system is not operating. Alternatively, the function of an electrolytic capacitor may be distributed to several electrolytic capacitors providing the equivalent capacitance so that the replacement of a single electrolytic capacitor is accomplished without a significant impact on the IPV system.

Typically, electrical and electronic devices have a degradation signature associated with the physical mechanism that is responsible for the failure. Generally speaking, failure is a continuous phenomena that happens over a period of time. Only the final exhibition of the failure is a discontinuous event. Leading up to the discontinuous event there is typically a change in externally measurable parameters, for example, the rise time and power dissipation of a switch device, the ESR of a capacitor, the inductance and loss factor of a magnetic device. A considerable part of device reliability characterization relies on using these externally measurable parameters to determine the accelerated degradation of electrical and electronic devices and to provide a statistical prediction of their reliability. Because failure in a single device is a stochastic process, an appropriate subset of the measurable parameters will need to be measured by measurement devices included in the DTAC. These measurements may be performed during operation of the system or during downtime of the system such as off daylight hours for an IPV system.

FIG. 1 shows a simplified circuit diagram for an IPV system. Photovoltaic cells 110 generate a DC current that is switched to AC using power switch 160 such as an IGBT. The AC current is typically coupled out of the IPV system to a power grid using transformer 160. As power switch 160 turns ON and OFF, current flows out off and into electrolytic capacitor 130. Ideally, the current as measured by ammeter 120 from electrolytic capacitor 130 is 90 degrees out phase with the voltage measured by voltmeter 125 across electrolytic capacitor 130. However, the presence of ESR across capacitor 130 will effect the phase difference, φ between the voltage and the current:

$$\tan^{-1}(\phi) = \frac{1/\omega_r C}{ESR} \quad (1)$$

where $\omega_r = 2\pi f_r$, where $f_r$ is the frequency of the ripple current and C the capacitance of electrolytic capacitor 130. The frequency, $f_r$, is typically set by the IPV or other DTAC system as the switching frequency using an oscillator or the clock rate of a processor. Hence, measurement of the phase difference, φ, the capacitance C and the frequency, $f_r$ of the ripple current can provide a measure of the ESR. The frequency of the ripple current, $f_r$, can be measured by a dedicated frequency counter that can measure frequencies on the order of kHz (not shown) and typically costs less than one dollar. Additionally, other critical parameters may be measured. For example, the temperature of electrolytic capacitor 130 is monitored using a thermocouple (not shown). Temperature is a critical parameter as for every 10° C. increase in temperature the lifetime of electrolytic capacitor 130 decreases by about a factor of two. Hence, in order to monitor electrolytic capacitor 130 it is useful to track the integrated time-temperature history. Other properties such as pressure and stress, for example, may be monitored as well. Numerous papers exist in the literature that relate to failure prediction for electrolytic capacitors, for example, "Influence of aging on electrolytic capacitors function in static converters: Fault prediction method", Venet et al., European Journal of Physics, 5, 71-83 (1999) and "Failure Prediction of Electrolytic Capacitors During Operation of a Switchmode Power Supply", Lahyani et al., IEEE Transactions on Power Electronics, vol. 13, No. 6, November 1998, both incorporated herein by reference. These factors enable the decision engine to supply a lifetime prediction for the electrolytic capacitor.

A secondary failure mechanism is power switch 160 which may be, for example, an IGBT, FET, GTO or ETO. As noted above, a primary failure mechanism for power switches is thermo-mechanical stress due to thermal or power cycling. Power switch 160 is made of materials having various coefficients of thermal expansion, which creates stresses when cycled in temperature. It should be noted that upset or overstress events such as excessive voltages on the terminals of power switch 160 or excessive currents of the collector of power switch 160 also effect the lifetime of power switch 160 by causing excessive heating. The effect of excessive voltage on heating is typically exponential while the effect of excessive current on heating is typically linear. The relevant lifetime parameter is the number of thermal cycles to failure which is a stochastic variable. An estimate of the lifetime of the system can be determined by assuming that the relevant components of power switch 160 fail as soon as a total amount of deformation work has been reached. Hence, the lifetime of power switch 160 can be determined from the ratio between the total amount of deformation work and the deformation work that has occurred to date. The deformation work to date is a function of the temperature swing during a load cycle and the number of load cycles. The installation of an integrated temperature sensor (not shown) in power switch 160 allows monitoring of the temperature swings over load cycles and provides an ability to estimate the remaining lifetime. Numerous papers exist in the literature that relate to thermo-mechanical failure prediction for power switches, for example, "A Novel Thermomechanics-Based Lifetime Prediction Model for Cycle Fatigue Failure Mechanisms In Power Semiconductors", Ciampi et al., Microelectronics Reliability, 42, 1653-1658, (2002) and "Failure Analysis of Power Modules: A Look at the Packaging and Reliability of Large IGBT's", Lambilly et al., IEEE Transactions of Components, Hybrids and Manufacturing Technology, vol. 16, no. 4, Jun. 1993, both incorporated herein by reference.

A group of research institutes, manufacturers and users has concerned itself with the issue of when an IGBT power module of a DTAC should be rated as defective or faulty. See, Proceedings of the 20th International Symposium for Testing and Failure Analysis, Los Angeles, Nov. 13-18, 1994, pp. 319-325, incorporated herein by reference. According to the recommendations of this group, an IGBT power module should be rated as defective or faulty when the collector-emitter voltage deviates from an initial value by more than twenty percent. The service life of an IGBT power module may be estimated with respect to those recommendations using the method disclosed in U.S. Pat. No. 5,877,419, incorporated herein by reference, which requires the ability to track load cycles and a quantity such as the collector-emitter voltage over those cycles using voltmeter 198. These factors enable the decision engine to supply a lifetime prediction for the power switch.

Once the failure physics are understood and correlated to externally measurable parameters, algorithms are derived to fit the real data from components in service. The algorithms used may be as simple as threshold settings, complete empirical data fits or as sophisticated as fits to numerical models of the physics of degradation that allow predictions of the "percent of life remaining". With this data, appropriate maintenance activity may be efficiently scheduled.

Typically, most larger scale (greater than 10 kW) power conversion devices already have a built in capability to communicate externally, typically to report on power delivery performance parameters. The technology is straightforward and varies from unsophisticated serial current-loop devices to 802.11 WiFi and cellular communication links. Other possibilities include wired-LAN and telephone modem links for more remote areas or smaller scale power conversion devices. Measurement data may be stored locally and downloaded on a daily or other regular basis.

Once the appropriate elements above are in place for assured reliability for DTAC, various methods may be applied to provide assured reliability to the customer. The particular method typically depends on the nature of the customer.

Residential or non-commercial customers typically purchase their PV or other residential type distributed power generation (DPG) systems from a local integrator/installer. For example, the customer typically bears the burden of the upfront costs to finance the system and the integrator/installer installs the PV system and assumes the responsibility for maintaining the PV system only during the warranty period. Currently, the majority of non-commercial customers do not monitor and maintain their PV systems. This is apparent from the fact that many non-commercial customers fail to realize that the PV system has failed or is not performing optimally. This derives from the fact that non-commercial systems typically have limited monitoring capability. For example, a non-commercial customer may only be aware of a malfunction when an unexpectedly large utility bill arrives. Communication capabilities are typically included in most IPV systems. The communication capabilities give the integrator/installer access to the IPV over communication links such as cellular or wired/wireless LAN. Implementation of an assured reliability method in accordance with the invention enables the IPV system to proactively provide data regarding the time to failure for the RLC. The integrator/installer benefits by having additional time to secure replacement parts, the ability to schedule maintenance at a time convenient for the integrator/installer and the ability to minimize system down time. An opportunity is also created for the integrator/installer to up-sell a monitoring service contract to non-commercial customers at the end of the warranty period.

Service to non-commercial customers may bring cost benefits as a result of the "network" effect. It is typically more efficient to schedule servicing calls if the non-commercial customers being serviced are in relatively close physical proximity to one another. Advance notification of the upcoming need for service of a DTAC provides the service provider the ability to do this. Without advance information regarding the need for service, the service provider must deal with maintenance requests as they come in and service personnel typically spend a considerable amount of time traveling to the job sites that may be randomly distributed over a given service area. More efficiency may be gained by aggregating service business from multiple integrators/installers in a given geographical area. Typically, multiple integrators/installers serve a given geographical area for non-commercial customers.

Commercial customers, typically those who purchase PV or other type of distributed power generation (DPG) systems larger than 10 kW also purchase their systems from integrators/installers. However, the financial structure of the transaction is a key difference. The integrator/installer typically enters into a contract in which the integrator/installer sells electricity to the customer at a guaranteed or preferred rate that is typically below market. The integrator/installer typically works with a third party lender to finance the installation of the DPG system. The commercial customer provides the required physical space and access to the facilities but does not own the DPG system. The commercial customer typically requires contractual performance guarantees regarding the amount of power provided per day from the integrator/installer which requires the installation of an on-site monitoring system to measure real time power production in addition to having a communications capability. For example, recently, for commercial PV installations, it has become more common for the installers to provide a guarantee of a certain level of power output from a PV installation. In this case, the integrator/installer would be notified in advance and schedule replacement during non-daylight hours. So, in contrast to non-commercial customers, the integrator/installer is immediately aware and contractually liable for any DPG system performance issues. The integrator/installer faces a considerable risk in the case of unplanned DPG system shutdowns that may be caused by DTAC component failures. Implementation of an assured reliability method in accordance with the invention effectively eliminates this financial risk which can be on the order of several thousand dollars or more per day. A further feature of an assured reliability method relates to inventory carrying costs. Large scale DPG systems typically use large scale DTAC which are commensurately more expensive then DTAC for smaller scale systems. The integrator/installer takes on a significant financial liability by having expensive DTAC components in inventory for to meet the need for unexpected DTAC system failures. Advance warning of DTAC component failures provides the integrator/installer with the ability to order "just in time" replacements.

Operation of the system for power assurance can be performed in a number of ways. In one embodiment, maintenance personnel receive notification of required maintenance when an RLC has reached the 20 percent of useful life remaining mark. This typically provides sufficient time to order and receive the replacement RLC and avoids the need for expensive inventory over longer periods of time and allows "just in time" replacement. When the RLC has reached the 10 percent of useful life remaining mark a further notification is provided to schedule a maintenance call to replace the RLC.

It should be noted that it is unlikely that simple "time" scheduling can be used because local variables such as temperature, utilization, load balancing between phases and time-varying reactive loads can all have significant effects on the rate of degradation of the RLCs. These local variables are typically out of control of all but the facility technicians or engineers who can only control these parameters to a small degree.

Figure 2:
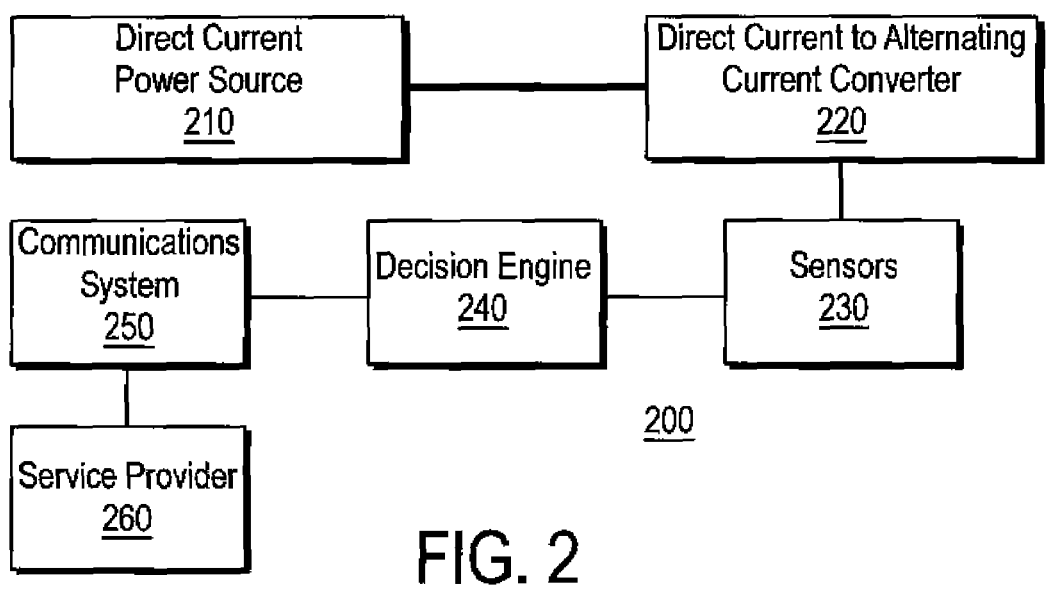
FIG. 2 shows an embodiment in accordance with the invention.

FIG. 2 shows system 200 in accordance with the invention. Direct current power source 210, which may be an Uninterruptible Power Supply, photovoltaic system, windpower systems, micro turbine power generating system other distributed power generating system, is electrically coupled to direct current to alternating current converter (DTAC) 220. DTAC 220 includes a number of RLCs that are monitored by sensors 220. Sensors 220 typically includes pressure sensors, voltage meters, ammeters, frequency counters and temperature sensors such as thermocouples. Sensors 220 communicate with decision engine 240 that uses the input from sensors 220 to determine an appropriate replacement time or lifetime estimate for the RLCs typically based on some combination of the understanding of the failure physics, thresholding, historical statistical performance records of similar devices, overall system performance and other similar factors. Decision engine 240 communicates via communication system 250 to service provider 260 to alert the service provider of the impending requirement for RLC replacement. Communication system 240 may be an unsophisticated serial current-loop device, 802.11 a WiFi or cellular communication link, wireless/wired-LAN or a telephone modem link for more remote areas or smaller scale power conversion devices.

The invention claimed is:

1. A distributed power generation system enabled for assured reliability comprising:
   a direct current power source;
   a direct current to alternating current converter (DTAC) electrically coupled to said direct current power source, said DTAC comprising a reliability limiting component (RLC) and a sensor for sensing a measurable parameter of said RLC;
   a decision engine communicatively coupled to said sensor, said decision engine operable to determine a lifetime estimate for said RLC based on said measurable parameter; and
   a service provider communicatively coupled to said decision engine by a communication system to receive a signal communicating said lifetime estimate, said service provider scheduling preventative maintenance based on said signal communicating said lifetime estimate.

2. The system of claim 1 wherein said RLC comprises a capacitor.

3. The system of claim 2 wherein said sensor measures a voltage drop across said capacitor.

4. The system of claim 2 wherein said sensor measures a frequency of a ripple current of said capacitor.

5. The system of claim 2 wherein said sensor measures a current flowing out of said capacitor.

6. The system of claim 2 wherein said sensor measures a temperature of said capacitor.

7. The system of claim 1 wherein said RLC comprises a power switch.

8. The system of claim 7 wherein said sensor measures a voltage across said power switch.

9. The system of claim 7 wherein said sensor measures a temperature of said power switch.

10. The system of claim 1 wherein said power switch is selected from the group consisting of an integrated-gate insulated transistor, a field effect transistor, a gate turnoff device and an emitter turn-off device.

11. The system of claim 1 wherein said direct current power source comprises a photovoltaic (PV) system.

12. The system of claim 1 wherein said RLC comprises an inverter for photovoltaics.

13. The system of claim 11 wherein said service provider schedules said preventive maintenance in off-daylight hours.

14. The system of claim 1 wherein said direct current power source comprises a microturbine.

15. The system of claim 14 wherein said service provider is not an integrator/installer of said direct current power source.

16. The system of claim 1 wherein said direct current power source is installed for a non-commercial customer.

17. The system of claim 1 wherein said decision engine is co-located with said DTAC.

18. The system of claim 1 wherein said communication system comprises a large area network (LAN).

19. The system of claim 1 wherein said service provider make use of a just-in-time RLC replacement scheme.

20. The system of claim 1 wherein said decision engine provides said signal to said service provider when said lifetime estimate of said RLC is less than twenty percent.

* * * * *

UNITED STATES PATENT AND TRADEMARK OFFICE
CERTIFICATE OF CORRECTION

PATENT NO. : 7,610,174 B2
APPLICATION NO. : 11/555135
DATED : October 27, 2009
INVENTOR(S) : S Jeffrey Rosner et al.

It is certified that error appears in the above-identified patent and that said Letters Patent is hereby corrected as shown below:

In column 8, line 24, in Claim 12, delete "claim 1" and insert -- claim 11 --, therefor.

Signed and Sealed this

Twelfth Day of January, 2010

David J. Kappos
*Director of the United States Patent and Trademark Office*